United States Patent
Naasani et al.

(10) Patent No.: US 9,082,941 B2
(45) Date of Patent: Jul. 14, 2015

(54) SEMICONDUCTOR NANOPARTICLE-BASED MATERIALS FOR USE IN LIGHT EMITTING DIODES, OPTOELECTRONIC DISPLAYS AND THE LIKE

(75) Inventors: Imad Naasani, Manchester (GB); Hao Pang, Sale (GB); Siobhan S. Daniels, Hadfield (GB); Emma Fitzgerald, Leyland (GB); Mark McCairn, Littleborough Shore (GB)

(73) Assignee: Nanoco Technologies, LTD. (GB)

( * ) Notice: Subject to any disclaimer, the term of this patent is extended or adjusted under 35 U.S.C. 154(b) by 0 days.

(21) Appl. No.: 13/485,292

(22) Filed: May 31, 2012

(65) Prior Publication Data

US 2013/0105839 A1 May 2, 2013

Related U.S. Application Data

(60) Provisional application No. 61/493,719, filed on Jun. 6, 2011.

(30) Foreign Application Priority Data

May 31, 2011 (GB) .................................. 1109054.5

(51) Int. Cl.
- *H01L 33/00* (2010.01)
- *H01L 33/50* (2010.01)
- *H01L 33/56* (2010.01)
- *C09K 11/02* (2006.01)
- *C09K 11/56* (2006.01)
- *C09K 11/70* (2006.01)
- *C09K 11/88* (2006.01)
- *C08L 33/06* (2006.01)
- *C08F 222/10* (2006.01)
- *C08F 220/18* (2006.01)

(52) U.S. Cl.
CPC .............. *H01L 33/502* (2013.01); *C09K 11/02* (2013.01); *C09K 11/565* (2013.01); *C09K 11/70* (2013.01); *C09K 11/883* (2013.01); *H01L 33/501* (2013.01); *H01L 33/56* (2013.01); *C08F 222/1006* (2013.01); *C08F 2220/1883* (2013.01); *C08L 33/06* (2013.01); *H01L 2933/0041* (2013.01)

(58) Field of Classification Search
CPC ......... C08K 5/34; C08L 25/18; H01L 33/501; H01L 33/56; H01L 29/786
USPC ..................... 257/57, 98; 438/27; 252/519.34
See application file for complete search history.

(56) References Cited

U.S. PATENT DOCUMENTS

| | | | |
|---|---|---|---|
| 6,061,117 A * | 5/2000 | Horie et al. .................... | 349/156 |
| 2007/0034833 A1 | 2/2007 | Parce et al. | |
| 2008/0173886 A1 | 7/2008 | Cheon et al. | |
| 2010/0155749 A1 | 6/2010 | Chen et al. | |
| 2011/0068321 A1 * | 3/2011 | Pickett et al. .................... | 257/13 |

OTHER PUBLICATIONS

Lou et al.. "Synthesis of High-Luminescent Cadium Sulfide Nanocrystallites by a Novel Single-Source Precursor Route", Materials Letters, North Holland Publishing Co. Amsterdam, NL, vol. 67, No. 17, Jul. 1, 2007, pp. 3612-3615.
International Search Report for International Application No. PCT/GB2012/051218 mailed Jul. 31, 2012.
International Search Report for International Application No. PCT/GB2012/051218 mailed Nov. 23, 2012.

* cited by examiner

*Primary Examiner* — Colleen A Matthews
*Assistant Examiner* — Colleen E Snow
(74) *Attorney, Agent, or Firm* — Wong, Cabello, Lutsch, Rutherford & Brucculeri LLP.

(57) ABSTRACT

A formulation incorporates nanoparticles, particularly quantum dot (QD) nanoparticles, into an optically clear medium (resin) to be used as a phosphor material in lighting and display applications, and as a down converting phosphor material in LEDs (light emitting diodes). The resin is compatible with QDs to allow high performance and stability of QD-based LEDs, lighting and display applications.

8 Claims, 1 Drawing Sheet

Figure 1:
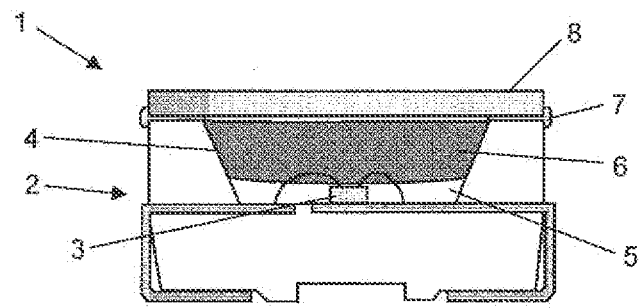

SEMICONDUCTOR NANOPARTICLE-BASED MATERIALS FOR USE IN LIGHT EMITTING DIODES, OPTOELECTRONIC DISPLAYS AND THE LIKE

CROSS-REFERENCE TO A RELATED APPLICATION

This is a non-provisional application which claims priority to provisional application 61/493,719, filed Jun. 6, 2011, and also claims priority to Great Britain application 1109054.5, filed May 31, 2011, the contents of each of these applications are incorporated herein by reference.

FIELD OF THE INVENTION

Embodiments of the present invention relate to semiconductor nanoparticle-based materials for use in light emitting devices, such as, but not limited to, light emitting diodes (LEDs) and optoelectronic displays. Particularly, but not exclusively, embodiments of the present invention relate to resin formulations for use in the fabrication of quantum dot (QD)-based light emitting devices, methods for producing said formulations, processes for fabricating such devices employing said formulations and the devices thus formed.

BACKGROUND

Light-emitting diodes (LEDs) are becoming more important to modern day life and it is envisaged that they will become one of the major applications in many forms of lighting such as automobile lights, traffic signals, general lighting, liquid crystal display (LCD) backlighting and display screens. Currently, LED devices are made from inorganic solid-state compound semiconductors, such as AlGaAs (red), AlGaInP (orange-yellow-green), and AlGaInN (green-blue), however, using a mixture of the available solid-state compound semiconductors, solid-state LEDs which emit white light cannot be produced. Moreover, it is difficult to produce "pure" colors by mixing solid-state LEDs of different frequencies. Therefore, currently the main method of color mixing to produce a required color, including white, is to use a combination of phosphorescent materials which are placed on top of the solid-state LED whereby the light from the LED (the "primary light") is absorbed by the phosphorescent material and then re-emitted at a different frequency (the "secondary light"), i.e. the phosphorescent materials down convert the primary light to the secondary light. Moreover, the use of white LEDs produced by phosphor down-conversion leads to lower cost and simpler device fabrication than a combination of solid-state red-green-blue LEDs.

Current phosphorescent materials used in down converting applications absorb UV or mainly blue light and converts it to longer wavelengths, with most phosphors currently using trivalent rare-earth doped oxides or halophosphates. White emission can be obtained by blending phosphors which emit in the blue, green and red regions with that of a blue or UV emitting solid-state device. i.e. a blue light emitting LED plus a green phosphor such as, $SrGa_2S_4:Eu_2+$, and a red phosphor such as, $SrSiEu_2+$ or a UV light emitting LED plus a yellow phosphor such as, $Sr_2P_2O_7:Eu_2+;Mu_2+$, and a blue-green phosphor. White LEDs can also be made by combining a blue LED with a yellow phosphor, however, color control and color rendering is poor when using this methodology due to lack of tunability of the LEDs and the phosphor. Moreover, conventional LED phosphor technology uses down converting materials that have poor color rendering (i.e. color rendering index (CRI)<75).

There has been substantial interest in exploiting the properties of compound semiconductors consisting of particles with dimensions in the order of 2-50 nm, often referred to as quantum dots (QDs) or nanocrystals. These materials are of commercial interest due to their size-tuneable electronic properties which can be exploited in many commercial applications such as optical and electronic devices and other applications that ranging from biological labeling, photovoltaics, catalysis, biological imaging, LEDs, general space lighting and electroluminescent displays amongst many new and emerging applications.

The most studied of semiconductor materials have been the chalcogenides II-VI materials namely ZnS, ZnSe, CdS, CdSe, CdTe; most noticeably CdSe due to its tuneability over the visible region of the spectrum. Reproducible methods for the large scale production of these materials have been developed from "bottom up" techniques, whereby particles are prepared atom-by-atom, i.e. from molecules to, clusters to particles, using "wet" chemical procedures.

Two fundamental factors, both related to the size of the individual semiconductor nanoparticle, are at least in part responsible for their unique properties. The first is 30 the large surface to volume ratio; as a particle becomes smaller, the ratio of the number of surface atoms to those in the interior increases. This leads to the surface properties playing an important role in the overall properties of the material. The second factor being, with many materials including semiconductor nanoparticles, that there is a change in the electronic properties of the material with size, moreover, because of quantum confinement effects the band gap gradually becomes larger as the size of the particle decreases. This effect is a consequence of the confinement of an 'electron in a box' giving rise to discrete energy levels similar to those observed in atoms and molecules, rather than a continuous band as observed in the corresponding bulk semiconductor material. Thus, for a semiconductor nanoparticle, because of the physical parameters, the "electron and hole", produced by the absorption of electromagnetic radiation, a photon, with energy greater than the first excitonic transition, are closer together than they would be in the corresponding macrocrystalline material, moreover the Coulombic interaction cannot be neglected. This leads to a narrow bandwidth emission, which is dependent upon the particle size and composition of the nanoparticle material. Thus, QDs have higher kinetic energy than the corresponding macrocrystalline material and consequently the first excitonic transition (band gap) increases in energy with decreasing particle diameter.

Core semiconductor nanoparticles, which consist essentially of a single semiconductor material along with an outer organic passivating layer, tend to have relatively low quantum efficiencies due to electron-hole recombination occurring at defects and dangling bonds situated on the nanoparticle surface which can lead to non-radiative electron-hole recombinations. One method to eliminate defects and dangling bonds on the inorganic surface of the QD is to grow a second inorganic material, having a wider band-gap and small lattice mismatch to that of the core material epitaxially on the surface of the core particle, to produce a "core-shell" particle. Core-shell particles separate any carriers confined in the core from surface states that would otherwise act as non-radiative recombination centers. One example is a ZnS shell grown on the surface of a CdSe core. Another approach is to prepare a core-multi shell structure where the "electron-hole" pair is completely confined to a single shell layer consisting of a few monolayers of a specific material such as a quantum dot-quantum well structure. Here, the core is of a wide band gap material, followed by a thin shell of narrower band gap material, and capped with a further wide band gap layer, such as CdS/HgS/CdS grown using substitution of Hg for Cd on the surface of the core nanocrystal to deposit just a few monolayers of HgS which is then over grown by a monolayer of CdS. The resulting structures exhibit clear confinement of photo-excited carriers in the HgS layer. To add further stability to QDs and help to confine the electron-hole pair one of the most common approaches is by epitaxially growing a compositionally graded alloy layer on the core to alleviate strain that could otherwise led to defects. Moreover for a CdSe core in order to improve structural stability and quantum yield, rather growing a shell of ZnS directly on the core a graded alloy layer of $Cd_{1-x}Zn_xSe_{1-y}S_y$ can be used. This has been found to greatly enhance the photoluminescence emission of the QDs.

Doping QDs with atomic impurities is an efficient way also of manipulating the emission and absorption properties of the nanoparticle. Procedures for doping of wide band gap materials, such as zinc selenide and zinc sulfide, with manganese and copper (ZnSe:Mn or ZnS:Cu), have been developed. Doping with different luminescence activators in a semiconducting nanocrystal can tune the photoluminescence and electroluminescence at energies even lower than the band gap of the bulk material whereas the quantum size effect can tune the excitation energy with the size of the QDs without having a significant change in the energy of the activator related emission.

SUMMARY AND DETAILED DESCRIPTION

Embodiments of the present invention obviate or mitigate one or more of the problems with current methods for fabricating semiconductor nanoparticle-based light emitting devices. In a first aspect, embodiments of the present invention provide a formulation for use in the fabrication of a light emitting device, said formulation comprising or consisting essentially of a population of semiconductor nanoparticles comprising or consisting essentially of ions from groups 13 and 15 of the Periodic Table, said nanoparticles being incorporated into an optically transparent poly(meth)acrylate encapsulation medium.

Embodiments of the present invention relate to the incorporation of fluorescent semiconductor nanoparticles (e.g. quantum dots (QDs) into an optically clear and chemically stable medium, which may be referred to herein as a "resin"—this term may encompass any suitable host material in which the semiconductor nanoparticles are incorporated. Embodiments of the present invention provide formulations or resins incorporating the nanoparticles alone (the nanoparticles being embedded directly in the encapsulation medium or resin), nanoparticles contained in or associated with beads or bead-like architectures, or combinations thereof.

The formulation according to various embodiments of the present invention allows QDs particularly, in particular III-V QDs, to be used as a phosphor material with high performance, minimal aggregation, and preserved quantum yield in the final light-emitting device.

In a second aspect, embodiments of the present invention provide a formulation for use in the fabrication of a light emitting device, said formulation comprising or consisting essentially of a population of semiconductor nanoparticles incorporated into an optically transparent poly(meth)acrylate encapsulation medium derived from a (meth)acrylate monomer and a trivalent crosslinking compound.

In a third aspect, embodiments of the present invention provide a formulation for use in the fabrication of a light emitting device said formulation comprising or consisting essentially of a population of semiconductor nanoparticles incorporated into an optically transparent polymeric encapsulation medium derived from a laurylmethacrylate monomer and a multivalent crosslinking compound reacted in the presence of a photoinitiator.

The poly(meth)acrylate may be any suitable (meth)acrylate-based polymer. It preferably incorporates a medium-to-long carbon chain, such as a $C_8$-$C_{20}$ carbon chain, more preferably a $C_{12}$-$C_{18}$ carbon chain. It is preferred that the poly (meth)acrylate is selected from the group consisting of polylauryl (meth)acrylate, polystearyl (meth)acrylate, polytrimethylsilyl (meth)acrylate, polytrimethylsilyloxyalkyl (meth)acrylate (e.g. 2-(Trimethylsilyloxy)ethyl methacrylate), polyglycidyl(meth)acrylate, methyl (meth)acrylate, and combinations thereof. Each of the aforementioned acylates may be substituted or unsubstituted with one or more chemical groups, such as an alkyl group, for example a methyl, ethyl or propyl group. Structures of the monomers from which these polymers may be obtained are set out below. It is particularly preferred that said poly(meth)acrylate is polylaurylmethacrylate.

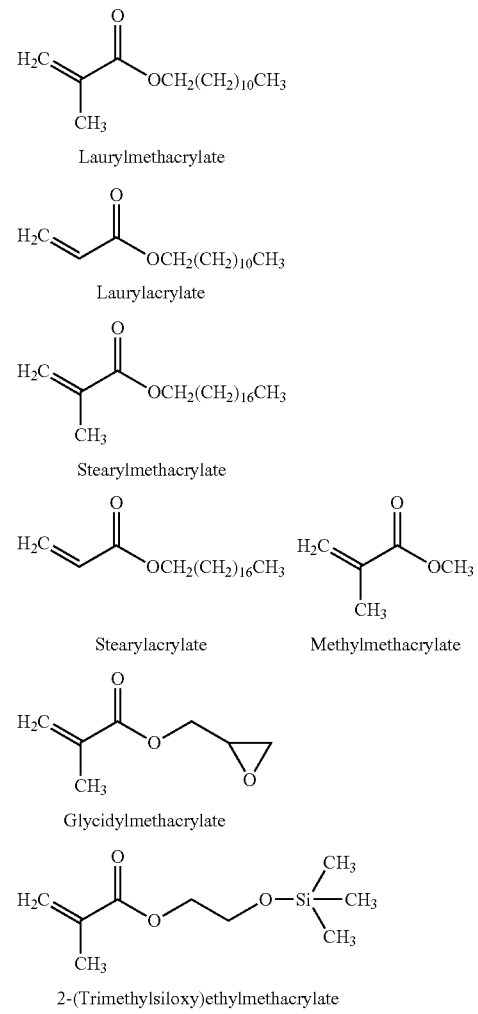

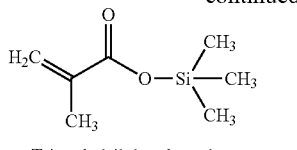
Trimethylsilylmethacrylate

In various embodiments, it is preferred that said poly (meth)acrylate encapsulation medium is derived from a (meth)acrylate monomer, preferably laurylmethacrylate, and a trivalent crosslinking compound.

In embodiments of the present invention, any suitable multivalent crosslinking agent may be used provided it is compatible with the (meth)acrylate monomer(s) being used and the photoinitiator. A trivalent crosslinking compound is preferred, such as trimethylolpropanetrimethacrylate. The structures of trimethylolpropanetrimethacrylate and another preferred trivalent crosslinking compound are set forth below.

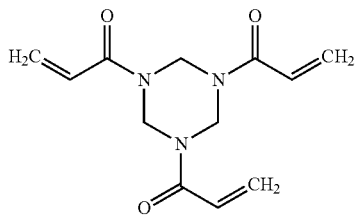
1,3,5-Triacryloylhexahydro-1,3,5-triazine

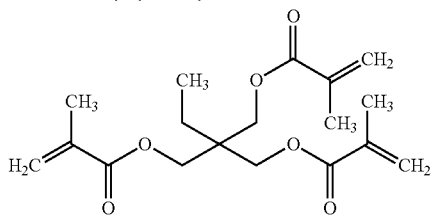
Trimethylolpropanetrimethacrylate

In various embodiments, the monomer and crosslinking compound are preferably reacted in the presence of a photoinitiator. Any suitable photoinitiator may be used provided it is compatible with the (meth)acrylate monomer(s) and crosslinking compound being used. A preferred type of photoinitiator is a bis-acylphosphine oxide (BAPO) photoinitiator, such as bis(2,4,6-trimethylbenzoyl)phenylphosphineoxide, which is marketed as Irgacure 819®

The photoinitiator (e.g., Irgacure 819®) is preferably dissolved in the crosslinker (e.g., trimethylolpropanetrimethacrylate). This may then be added to the (meth)acrylate monomer(s) to provide an encapsulant precursor mixture. An aliquot of the mixture is then added to a sample of the desired semiconductor nanoparticles (e.g. cadmium-free QDs, such as III-V (e.g. InP) QDs). The nanoparticle-containing mixture may then be used to fabricate the desired light emitting device. By way of example, an appropriate volume of the nanoparticle-containing mixture may be deposited into a cup of an LED or used to make a phosphor sheet using any appropriate technique for generating a nanoparticle film (e.g. inkjet printing, casting, doctor blade, roller coating, screen printing etc). The filled LED or printed display device may then be irradiated to provide a cured, optically transparent matrix that incorporates the desired type(s) of nanoparticles.

The formulation according to any aspect of the present invention may include one or more additives to aid the preparation of the formulation, processibility of the formulation and/or to enhance the performance of the final device. Additives may include one or more from the following group: polymerization enhancers (e.g. benzophenones, $BF_3$); waveguiding materials (e.g. fumed silica and its derivatives, polymethylmethacrylate (PMMA)); agents for increasing viscosity (e.g. fumed silica, hydrophobic polymers, polylaurylmethacrylate (PLMA), dextrin palmitate); agents for enhancing light transmittance; and agents for improving the solubility of the nanoparticles in the encapsulant precursor mixture (which, in a preferred embodiment, is basic). Additionally or alternatively the formulation may include additives to enhance the mechanical and/or tensile properties or the finally cured material, and/or the weathering of the final device, e.g. an LED (e.g. $TiO_2$ nanopowders, silicone hydride containing siloxanes and siloxane polymers, fumed silica).

The semiconductor nanoparticles in the first aspect which contain ions from groups 13 and 15 of the Periodic Table preferably contain one or more semiconductor material selected from the group consisting of InP, InAs, InSb, AlP, AlS, AlAs, AlSb, GaN, GaP, GaAs, GaSb and combinations thereof. In the second and third aspects of the present invention the semiconductor nanoparticles may contain ions selected from group 11, 12, 13, 14, 15 and/or 16 of the periodic table, or said semiconductor nanoparticles may contain one or more types of transition metal ion or d-block metal ion. By way of example, said semiconductor nanoparticles may contain one or more semiconductor material selected from the group consisting of CdS, CdSe, CdTe, ZnS, ZnSe, ZnTe, InP, InAs, InSb, AlP, AlS, AlAs, AlSb, GaN, GaP, GaAs, GaSb, PbS, PbSe, Si, Ge, MgS, MgSe, MgTe, and combinations thereof.

The semiconductor nanoparticles may be dispersed directly into the encapsulation medium, incorporated into a plurality of discrete microbeads which are then dispersed or embedded within said encapsulation medium, or a combination may be used.

The term "beads" is used for convenience and is not intended to impose any particular size or shape limitation. Thus, for example, the beads may be spherical but other configurations are possible, such as disc- or rod-like. Where reference is made herein to "microbeads" this is intended to refer to "beads" as defined above having a dimension on the micron scale. The nanoparticle-containing optically transparent medium is generally provided in the form of a plurality of discrete, i.e. separate or distinct, microbeads. For the avoidance of doubt, reference to microbeads as being "discrete" is not intended to exclude composite materials formed by aggregations of microbeads since even in such materials each microbead retains its original bead-like structure despite being in contact with one or more other microbeads. By pre-loading small microbeads, which may range in size from 50 nm to 500 μm or more preferably 25 nm to 0.1 mm or more preferably still 20 nm to 0.5 mm in diameter, with QDs, then incorporating one or more of these QD-containing beads into an LED encapsulation material on a UV or blue LED, changing, in a controllable and reproducible manner, the color of the light emitted by the LED device is facilitated. Moreover, it has been shown that this approach may be much simpler than attempting to directly incorporate the QDs directly into an LED encapsulate in terms of ease of color rendering, processing, and reproducibility and offers greater QD stability to photo-oxidation. This approach may lead to better processing; the QD-containing beads may be made to the same size as the currently employed YAG phosphor material which range from 10 to 100 µm and may thus be supplied to commercial manufacturers in a similar form to that of the current commercially used phosphor material. Moreover, the QD-containing beads are in a form that is compatible with the existing LED fabrication infrastructure.

The material from which the beads or microbeads are made is preferably optically transparent medium and may be made in the form of a resin, polymer, monolith, glass, sol gel, epoxy, silicone, (meth)acrylate or the like using any appropriate method. It is preferred that the resulting nanoparticle-containing bead is suitably compatible with the optically transparent encapsulating medium to enable the nanoparticle-containing beads to be embedded within the encapsulant such that the chemical and physical structure of the resulting composite material (i.e. the encapsulant with nanoparticle-containing beads embedded therein) remains substantially unchanged during further processing to incorporate the composite into a light emitting device and during operation of the resulting device over a reasonable lifetime for the device. Suitable bead materials include: poly(methyl (meth)acrylate) (PMMA); poly(ethylene glycol dimethacrylate) (PEGMA); poly(vinyl acetate) (PVA); poly(divinyl benzene) (PDVB); poly(thioether); silane monomers; epoxy polymers; and combinations thereof. A particularly preferred bead material which has been shown to exhibit excellent processibility and light emitting device performance comprises or consists essentially of a copolymer of PMMA, PEGMA and PVA. Other preferred bead materials employ polystyrene microspheres with divinyl benzene and a thiol co-monomer; silane monomers (e.g. 3-(trimethoxysilyl) propylmethacrylate (TMOPMA) and tetramethoxy silane (TEOS)); and an epoxy polymer (e.g. Optocast™ 3553 from Electronic Materials, Inc., USA).

By incorporating at least some of the QDs into an optically transparent, preferably clear, stable bead material, the otherwise reactive QDs may be protected from the potentially damaging surrounding chemical environment. Moreover, by placing a number of QDs into a single bead, for example in the size range from 20 nm to 500 µm in diameter, the subsequent QD-bead may be more stable, than free or "naked" QDs, to the types of chemical, mechanical, thermal and photo-processing steps which are required to incorporate QDs in most commercial applications, such as when employing quantum dots as down converters in a "QD-solid-state-LED" light emitting device.

The formulation according to embodiments of the present invention may contain a population of semiconductor nanoparticles distributed across a plurality of beads embedded within the optically transparent encapsulating medium. Any desirable number of beads may be embedded, for example, the encapsulating medium may contain 1 to 10,000 beads, more preferably 1 to 5000 beads, and most preferably 5 to 1000 beads.

Some or all of the nanoparticle-containing microbeads may include a core comprising or consisting essentially of a first optically transparent material and one or more outer layers or shells of the same or one or more different optically transparent materials deposited on said core. Nanoparticles may be confined to the core region of the microbeads or may be dispersed throughout the core and/or one or more of the shell layers of the microbeads.

Advantages of QD-containing beads over free QDs may include greater stability to air and moisture, greater stability to photo-oxidation and greater stability to mechanical processing. Moreover, by pre-loading small microbeads, which may range in size from a few 50 nm to 500 µm, with QDs then incorporating one or more of these QD-containing beads into the encapsulating medium on a UV or blue LED, it may be a relatively simple process to change, in a controllable and reproducible manner, the color of the light emitted by the LED-based light emitting device.

While incorporating semiconductor nanoparticles into beads may afford some or all of the aforementioned advantages, it is preferred that the formulation according to the first aspect of the present invention comprises or consists essentially of at least some semiconductor nanoparticles comprising or consisting essentially of ions from groups 13 and 15 of the Periodic Table which are dispersed directly into the encapsulation medium. That is, the formulation according to the first aspect preferably contains semiconductor nanoparticles containing group 13 and 15 ions which are not incorporated into beads or microbeads, and optionally contains further semiconductor nanoparticles, which may or may not contain group 13 and/or 15 ions, 10 that are incorporated into beads or microbeads. In this way, the optical properties of the final device may be optimized and/or maximized for a particular application. For example, by using a mixture of bead-encapsulated QDs with non-bead encapsulated QDs (i.e. "bare" or "naked" QDs), the final device may benefit from both the advantages of the bead-encapsulated QDs in terms of robustness, processibility etc. while also benefiting from advantages associated with using QDs dispersed directly within the encapsulating medium, such as increased brightness, optical clarity and/or quantum yield due to the omission of the additional layer of encapsulating bead material and the associated additional processing steps required to combine the QDs with the beads. It is further preferred that the formulations according to the second and/or third aspects of the present invention comprise or consist essentially of at least some semiconductor nanoparticles which are dispersed directly into the encapsulation medium. In a particularly preferred embodiment of the first, second and/or third aspect of the present invention all of the semiconductor nanoparticles are dispersed directly into the encapsulation medium, i.e. none of the semiconductor nanoparticles are incorporated into beads or microbeads dispersed within the encapsulation medium. In this way, the advantages of providing the QDs directly into the encapsulation medium, rather than first incorporating them into beads, may be obtained.

In a fourth aspect, embodiments of the present invention provide a method of preparing a formulation for use in the fabrication of a light emitting device, said method comprising or consisting essentially of incorporating a population of semiconductor nanoparticles comprising or consisting essentially of ions from groups 13 and 15 of the Periodic Table into an optically transparent poly(meth)acrylate encapsulation medium.

The poly(meth)acrylate encapsulation medium is preferably derived from a (meth)acrylate monomer and a trivalent crosslinking compound. It is preferred that the fourth aspect of the present invention is applied to produce a formulation according to the first aspect of the present invention defined above or a preferred embodiment thereof.

In a fifth aspect, embodiments of the present invention provide a method of preparing a formulation for use in the fabrication of a light emitting device, said method comprising or consisting essentially of incorporating a population of semiconductor nanoparticles into an optically transparent poly(meth)acrylate encapsulation medium derived from a (meth)acrylate monomer and a trivalent crosslinking compound.

The monomer and crosslinking compound are preferably reacted in the presence of a photoinitiator. It is preferred that the fifth aspect of the present invention is applied to produce a formulation according to the second aspect of the present invention defined above or a preferred embodiment thereof.

In a sixth aspect, embodiments of the present invention provide a method of preparing a formulation for use in the fabrication of a light emitting device, said method comprising or consisting essentially of incorporating a population of semiconductor nanoparticles into an optically transparent polymeric encapsulation medium derived from a laurylmethacrylate monomer and a trivalent crosslinking compound reacted in the presence of a photoinitiator.

It is preferred that the sixth aspect of the present invention is applied to produce a formulation according to the third aspect of the present invention defined above or a preferred embodiment thereof.

In the fourth, fifth and sixth aspects of the present invention it is preferred that said monomer, crosslinking compound and photoinitiator are combined to provide an encapsulant precursor mixture to which is then added the semiconductor nanoparticles prior to polymerization of said monomer to provide said polymeric optically transparent encapsulation medium. In this way the need to include a nanoparticle capping agent, such as TOP or TOPO, in the mixture containing the nanoparticles and the polymerizable monomer may be avoided.

In the fourth, fifth and sixth aspects of the present invention it is preferred that said semiconductor nanoparticles are produced by converting a nanoparticle precursor composition to the material of the nanoparticles in the presence of a molecular cluster compound under conditions permitting seeding and growth of the nanoparticles on the cluster compound. The nanoparticles may incorporate first and second ions, in which case the nanoparticle precursor composition may comprise or consist essentially of separate first and second nanoparticle precursor species containing said first and second ions respectively for incorporation into the growing nanoparticles or the first and second ions may be combined into a single molecular species containing both types of ions for incorporation into the growing nanoparticles.

In a seventh aspect, embodiments of the present invention provide a light emitting device including or consisting essentially of a primary light source in optical communication with a formulation comprising or consisting essentially of a population of semiconductor nanoparticles comprising or consisting essentially of ions from groups 13 and 15 of the Periodic Table, said nanoparticles being incorporated into an optically transparent (meth)acrylate encapsulation medium.

In a further aspect, embodiments of the present invention provide a method of fabricating a light emitting device comprising or consisting essentially of providing a population of semiconductor nanoparticles comprising or consisting essentially of ions from groups 13 and 15 of the Periodic Table in an optically transparent poly(meth)acrylate encapsulation medium to produce a nanoparticle-containing formulation, and depositing said formulation onto a primary light source such that said primary light source is in optical communication with said population of 30 semiconductor nanoparticles.

In an eighth aspect, embodiments of the present invention provide a light emitting device including a primary light source in optical communication with a formulation comprising or consisting essentially of a population of semiconductor nanoparticles incorporated into an optically transparent poly (meth)acrylate encapsulation medium derived from a (meth) acrylate monomer and a trivalent crosslinking compound.

In another aspect, embodiments of the present invention provide a method of fabricating a light emitting device comprising or consisting essentially of providing a population of semiconductor nanoparticles in an optically transparent (meth)acrylate encapsulation derived from a (meth)acrylate monomer and a trivalent crosslinking compound medium to produce a nanoparticle-containing formulation, and depositing said formulation onto a primary light source such that said primary light source is in optical communication with said population of semiconductor nanoparticles.

In a ninth aspect, embodiments of the present invention provide a light emitting device including a primary light source in optical communication with a formulation comprising or consisting essentially of a population of semiconductor nanoparticles incorporated into an optically transparent polymeric encapsulation medium derived from a laurylmethacrylate monomer and a trivalent crosslinking compound reacted in the presence of a photoinitiator.

In a further aspect, embodiments of the present invention provide a method of fabricating a light emitting device comprising or consisting essentially of providing a population of semiconductor nanoparticles in an optically transparent polymeric encapsulation medium derived from a laurylmethacrylate monomer and a trivalent crosslinking compound reacted in the presence of a photoinitiator to produce a nanoparticle-containing formulation, and depositing said formulation onto a primary light source such that said primary light source is in optical communication with said population of semiconductor nanoparticles.

The primary light source in any of the above-defined devices or methods may be selected from the group consisting of a light emitting diode, a laser, an arc lamp, and a blackbody light source.

In each of the devices according to the seventh, eighth and ninth aspects of the present invention it is preferred that said formulation is in accordance with the first, second or third aspects of the present invention respectively or preferred embodiments thereof.

Embodiments of the current invention provide a semiconductor nanoparticle formulation for use in the fabrication of light emitting devices, preferably with the devices incorporating an LED as a primary light source and the semiconductor nanoparticles as a secondary light source. In a preferred embodiment the formulation contains one or more types of semiconductor nanoparticles, such as QDs, incorporated into a plurality of polymeric beads which are embedded or entrapped within the optically transparent poly(meth)acrylate encapsulation medium.

In the Comparative Example below an LED-based light emitting device incorporating a formulation according to embodiments of the present invention is tested against a light emitting device incorporating similar QDs embedded directly in a commercially available silicone LED encapsulant analogous to prior art devices. The device incorporating the formulation according to embodiments of the present invention was observed to perform significantly better than the prior art device in that it exhibited a significantly enhanced LED lifetime as compared to device incorporating QDs dispersed in the silicone LED encapsulant.

The optically transparent medium may contain any desirable number and/or type of semiconductor nanoparticles. The medium may contain a single type of semiconductor nanoparticle, e.g. InP or CdSe, of a specific size range, such that the composite material incorporating the nanoparticles incorporated within the medium emits monochromatic light of a pre-defined wavelength, i.e. color. The color of the emitted light may be adjusted by varying the type of semiconductor nanoparticle material used, e.g. changing the size of the nanoparticle, the nanoparticle core semiconductor material, and/or adding one or more outer shells of different semiconductor materials. Moreover, color control may also be achieved by incorporating different types of semiconductor nanoparticles, for example nanoparticles of different size and/or chemical composition within the optically transparent medium. Furthermore, the color and colour intensity may be controlled by selecting an appropriate number of semiconductor nanoparticles within the optically transparent medium. Preferably the medium contains at least around 1000 semiconductor nanoparticles of one or more different types, more preferably at least around 10,000, more preferably at least around 50,000, and most preferably at least around 100,000 semiconductor nanoparticles of one or more different types.

Color Indexing

The color of the light output from the QD-bead-LED (the "secondary light") may be measured using a spectrometer. The spectral output (mW/nm) may then be processed mathematically so that the particular color of the light emitting device may be expressed as color coordinates on a chromaticity diagram, for example the 2° CIE 1931 chromaticity diagram.

The 2° CIE 1931 chromaticity coordinates for a particular spectrum may be calculated from the spectral power distribution and the CIE 1931 color matching functions x, y, z. The corresponding tristimulus values may be calculated thus $$X = \int p x d\lambda \quad Y = \int p y d\lambda \quad Z = \int p z d\lambda$$

Where p is the spectral power, and x, y and z are the color matching functions. From X, Y, and Z the chromaticity coordinates x, y may be calculated according to $$x = \frac{X}{X+Y+Z} \text{ and } y = \frac{Y}{X+Y+Z}$$

Using x, y as the coordinates, a two-dimensional chromaticity diagram (the CIE 1931 color space diagram) may be plotted.

Color Rendering

Color rendering describes the ability of a light source to illuminate objects such that they appear the correct color when compared to how they appear when illuminated by a reference light source. Usually the reference light source is a tungsten filament bulb which is assigned a color rendering index (CRI) of 100. To be acceptable for general lighting, a white light emitting device source is typically required to have a CRI>80. An example of poor color rendering is the sodium street lamp which has very poor color rendering capability, i.e. it is difficult to distinguish a red car from a yellow car illuminated by a sodium lamp, in the dark under a sodium lamp they both appear grey.

Embodiments of the present invention provide a light-emitting device comprising or consisting essentially of a population of QDs incorporated into an optically transparent medium. The QDs within the optically transparent medium are in optical communication with a primary solid-state photon/light source (e.g. an LED, laser, arc lamp or black-body light source) such that, upon excitation by primary light from the primary light source the QDs within the optically transparent medium emit secondary light of a desired color. The required intensities and emission wavelengths of the light emitted from the device itself may be selected according to appropriate mixing of the color of the primary light with that of the secondary light(s) produced from the down conversion of the primary light by the QDs. Moreover, the size (and thus emission) and number of each type of QD within the optically transparent medium may be controlled, as may the size, morphology and constituency of the optically transparent medium, such that subsequent mixing of the QD-containing media enables light of any particular color and intensity to be produced.

It will be appreciated that the overall light emitted from the device may consist essentially of only the light emitted from the QDs, i.e. just the secondary light, or a mixture of light emitted from the QDs and light emitted from the solid-state/primary light source, i.e. a mixture of the primary and secondary light. Color mixing of the QDs may be achieved either within the QD-containing media or a mixture of differently colored optically transparent media with all the QDs within a specific medium being the same size/color (e.g. some containing all green QDs and others containing all red QDs).

Figure 2:
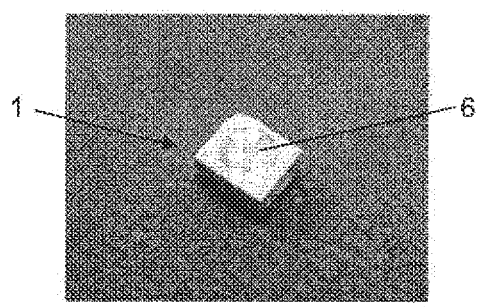
Figure 3:
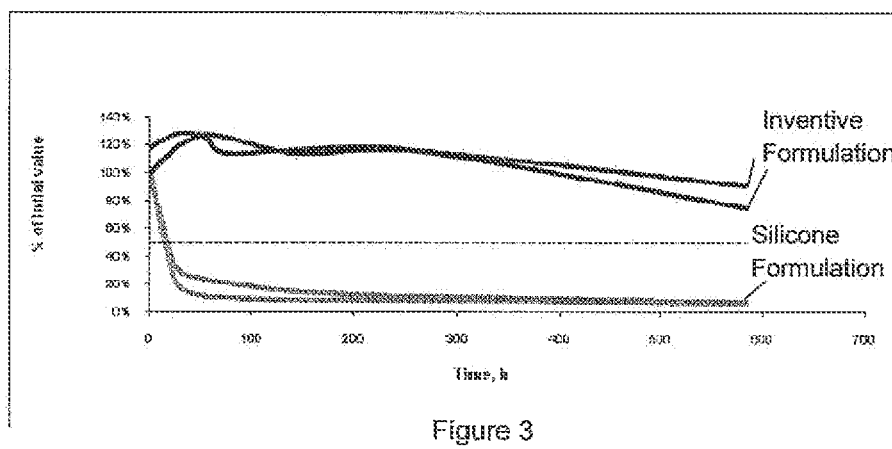

Embodiments of the present invention are illustrated with reference to the following non-limiting examples and figures in which:

FIG. 1 is a schematic representation of a QD-based light emitting device according to various embodiments of the present invention;

FIG. 2 is an ambient light photo of an LED filled with a cadmium-free QD acrylate resin according to various embodiments of the present invention; and FIG. 3 is a plot of QD-photoluminescence intensity expressed as a percentage of the initial value versus time for the a device according to various embodiments of the present invention and a device prepared using a common silicone QD encapsulant resin.

EXAMPLES

The Example below describes the preparation of QD-containing formulations for use in the fabrication of new, improved QD-based light emitting devices in accordance with embodiments of the present invention. In the Comparative Example a device in accordance with embodiments of the present invention is tested against a device based on prior art principles using the same type of QDs to compare the performance of the two devices. Two methods for producing QDs suitable for incorporation into said formulations are first set out in the Synthetic Methods section below.

Synthetic Methods

Method 1

Preparation of CdSelHDA Capped Nanoparticles

HDA (500 g) was placed in a three-neck round bottomed flask and dried and degassed by heating to 120° C. under a dynamic vacuum for >1 hour. The solution was then cooled to 60° C. To this was added 0.718 g of $[HNEt_3]_4[Cd_{10}Se_4(SPh)_{16}]$ (0.20 mmols). In total 42 mmols, 22.0 ml of TOPSe and 42 mmols, (19.5 ml, 2.15M) of $Me_2Cd.TOP$ was used. Initially 4 mmol of TOPSe and 4 mmols of $Me_2Cd.TOP$ were added to the reaction at room temperature and the temperature increased to 110° C. and allowed to stir for 2 hours. The reaction mixture was a deep yellow color. The temperature was progressively increased at a rate of ~1° C./5 min with equimolar amounts of TOPSe and $Me_2Cd.TOP$ being added dropwise. The reaction was stopped when the photoluminescence (PL) emission maximum had reached around 600 nm, by cooling to 60° C. followed by addition of 300 ml of dry ethanol or acetone. This produced a precipitation of deep red particles, which were further isolated by filtration. The resulting CdSe particles were recrystallized by re-dissolving in toluene followed by filtering through Celite followed by re-precipitation from warm ethanol to remove any excess HDA, selenium or cadmium present. This produced 10.10 g of HDA capped CdSe nanoparticles. Elemental analysis C=20.88%, H=3.58%, N=1.29%, Cd=46.43%. Max PL=585 nm, FWHM=35 nm. 38.98 mmols, 93% of Me$_2$Cd consumed in forming the QDs.

Preparation of CdSe/ZnS-HDA Capped Nanoparticles

HDA (800 g) was placed in a three neck round-bottom flask, dried and degassed by heating to 120° C. under a dynamic vacuum for >1 hour. The solution was then cooled to 60° C. To this was added 9.23 g of CdSe nanoparticles that have a PL maximum emission of 585 nm. The HDA was then heated to 220° C. To this was added by alternate dropwise addition a total of 20 ml of 0.5M Me$_2$Zn.TOP and 0.5M, 20 ml of sulfur dissolved in octylamine. Three alternate additions of 3.5, 5.5 and 11.0 ml of each were made, whereby initially 3.5 ml of sulfur was added dropwise until the intensity of the PL maximum was near zero. Then 3.5 ml of Me$_2$Zn.TOP was added dropwise until the intensity of the PL maximum had reached a maximum. This cycle was repeated with the PL maximum reaching a higher intensity with each cycle. On the last cycle, additional precursor was added once the PL maximum intensity been reached until it was between 5-10% below the maximum intensity, and the reaction was allowed to anneal at 150° C. for 1 hour. The reaction mixture was then allowed to cool to 60° C. whereupon 300 ml of dry "warm" ethanol was added which resulted in the precipitation of particles. The resulting CdSe—ZnS particles were dried before re-dissolving in toluene and filtering through Celite followed by re-precipitation from warm ethanol to remove any excess HDA. This produced 12.08 g of HDA capped CdSe—ZnS core-shell nanoparticles. Elemental analysis C=20.27%, H=3.37%, N=1.25%, Cd=40.11%, Zn=4.43%; Max PL 590 nm, FWHM 36 nm.

Method 2

Preparation of InP Core Quantum Dots (500-700 nm emission)

Di-butyl ester (100 ml) and myristic acid (10.0627 g) were placed in a three-neck flask and degassed at 70° C. under vacuum for one hour. After this period, nitrogen was introduced and the temperature increased to 90° C. ZnS molecular cluster [Et$_3$NH$_4$][Zn$_{10}$S$_4$(SPh)$_{16}$] (4.7076 g) was added and the mixture allowed to stir for 45 minutes. The temperature was then increased to 100° C. followed by the dropwise addition of In(MA)$_3$ (1M, 15 ml) followed by (TMS)$_3$P (1M, 15 ml). The reaction mixture was allowed to stir while increasing the temperature to 140° C. At 140° C., 35 further dropwise additions of In(MA)$_3$ (1M, 35 ml) (left to stir for 5 minutes) and (TMS)$_3$P (1M, 35 ml) were made. The temperature was then slowly increased to 180° C. and further dropwise additions of In(MA)$_3$ (1M, 55 ml) followed by (TMS)$_3$P (1M, 40 ml) were made. By addition of the precursor in the manner above nanoparticles of InP could be grown with the emission maximum gradually increasing from 520 nm up to 700 nm, whereby the reaction may be stopped when the desired emission maximum has been obtained and left to stir at this temperature for half an hour. After this period, the temperature was decreased to 160° C. and the reaction mixture was left to anneal for up to 4 days (at a temperature between 20-40° C. below that of the reaction). A UV lamp was also used at this stage to aid in annealing.

The nanoparticles were isolated by the addition of dried degassed methanol (approx. 200 ml) via cannula techniques. The precipitate was allowed to settle and then methanol was removed via cannula with the aid of a filter stick. Dried degassed chloroform (approx. 10 ml) was added to wash the solid. The solid was left to dry under vacuum for 1 day. This produced 5.60 g of InP core nanoparticles. Max PL=630 nm, FWHM=70 nm.

Post-Operative Treatments

The quantum yields of the InP QDs prepared above were increased by washing with dilute HF acid. The dots were dissolved in anhydrous degassed chloroform (~270 ml). A 50 ml portion was removed and placed in a plastic flask, flushed with nitrogen. Using a plastic syringe, the HF solution was made up by adding 3 ml of 60% w/w HF in water and adding to degassed THF (17 ml). The HF was added dropwise over 5 hours to the InP dots. After addition was complete the solution was left to stir overnight. Excess HF was removed by extracting through calcium chloride solution in water and drying the etched InP dots. The dried dots were re-dispersed in 50 ml chloroform for future use. PL max 567 nm, FWHM 60 nm. The quantum efficiencies of the core materials at this stage range from 25-90%.

Growth of a ZnS shell to provide InP/ZnS Core/Shell Quantum Dots

A 20 ml portion of the HF-etched InP core particles was dried down in a 3-neck flask. 1.3 g myristic acid and 20 ml di-n-butyl sebacate ester was added and degassed for 30 minutes. The solution was heated to 200° C. then 1.2 g anhydrous zinc acetate was added and 2 ml 1M (TMS)$_2$S was added dropwise (at a rate of 7.93 ml/hr) after addition was complete the solution was left to stir. The solution was kept at 200° C. for 1 hour then cooled to room temperature. The particles were isolated by adding 40 ml of anhydrous degassed methanol and centrifuged. The supernatant liquid was disposed of and to the remaining solid 30 ml of anhydrous degassed hexane was added. The solution was allowed to settle for 5 hours and then re-centrifuged. The supernatant liquid was collected and the remaining solid was discarded. PL emission peak Max.=535 nm, FWHM=65 nm. The quantum efficiencies of the nanoparticle core/shell materials at this stage ranged from 35-90%.

EXAMPLE

QD-Containing LED Preparation

A solution of cadmium-free quantum dots in toluene (e.g. 20 mg of InP/ZnS core/shell QDs produced as described above) is dried under vacuum to leave a QD residue. To the residue an acrylate monomeric mixture was added and the dots incubated until a clear solution was formed. The acrylate mixture was composed of laurylmethacrylate (1.85 ml, 6.6 mmol), a photoinitiator (Irgacure 819® (bis(2,4,6-trimethyl-benzoyl)-phenylphosphineoxide), 9 mg) dissolved in a crosslinker (trimethylolpropanetrimethacrylate (1.06 ml, 3.3 mmol)).

An aliquot of the monomer mixture (e.g. 1.5 to 3111) containing the QDs was used to fill a cup of an LED. The filled LED was then irradiated (Hamamatsu uv-LED lamp LC-L2, 365 nm, 7500 mW/cm$^2$, 10 min, 1 LED above & 1 LED below 8 cm distance) to provide a QD-polymethacrylate filled LED having the structure shown in FIGS. 1 and 2. With reference to FIG. 1 there is shown a light emitting device 1 comprising a conventional LED package 2 with a standard LED chip 3. Directly on top of the LED chip 3 within the LED well 4 is provided a sufficient volume of a commercially available silicone resin 5 so as to cover and submerge the LED chip 3. A sufficient volume of the QD-monomer mixture 6 is provided on top of the silicone layer 5 so as to substantially fill the LED well 4. Since the silicone resin 5 submerges the LED chip 3 there is a space between the chip 3 and the QD-monomer mixture 6 that is filled with the silicone resin 5. In this way, the QD-containing mixture 6 is insulated from the potentially harmful high temperatures generated by the chip 3 during operation. A UV curing epoxy resin 7 is provided around the periphery of the opening to the LED well 4, upon which is provided a thin layer of an encapsulating material 8, such as glass. The epoxy resin 7 and QD-monomer mixture 6 are then exposed to UV radiation as described above to cure the resin 7 and seal the device 1, and to polymerize and crosslink the QD-monomer mixture 6.

Comparative Example

LEDs were fabricated using either a standard commercially available silicon resin (SCR1011®, ShinEtsu) or an acrylate resin according to on the current invention. The LEDs were operated at 20 mAmp and generated a 450 nm blue light with 22 mW intensity. FIG. 3 demonstrates the difference in the stability and performance of the LEDs. The acrylate based resin according to embodiments of the present invention provided a remarkable increase in stabilization of the encapsulated QDs on the LED as compared to the LED incorporating QDs dispersed in the commercially available silicon resin.

The invention claimed is:

1. A formulation for use in the fabrication of a light emitting device, said formulation comprising or consisting essentially of:
a population of semiconductor nanoparticles comprising ions from groups 13 and 15 of the Periodic Table, said nanoparticles being incorporated into an optically transparent poly(meth)acrylate encapsulation medium derived from laurylmethacrylate monomer and a trivalent crosslinking compound.

2. A formulation according to claim 1, wherein said trivalent crosslinking compound is a trivalent crosslinking compound, such as trimethylolpropanetrimethacrylate.

3. A formulation according to claim 1, wherein said monomer and crosslinking compound are reacted in the presence of a photoinitiator.

4. A formulation according to claim 1, wherein said poly(meth)acrylate is polylaurylmethacrylate.

5. A formulation according to claim 1, wherein said semiconductor nanoparticles contain one or more semiconductor materials selected from the group consisting of InP, InAs, InSb, AlP, AlS, AlAs, AlSb, GaN, GaP, GaAs, GaSb, and combinations thereof.

6. A formulation according to claim 1, wherein said population of semiconductor nanoparticles is incorporated into a plurality of discrete microbeads, said nanoparticle-containing microbeads being embedded within said encapsulation medium.

7. A formulation for use in the fabrication of a light emitting device, said formulation comprising:
a population of semiconductor nanoparticles incorporated into an optically transparent polymeric encapsulation medium derived from a laurylmethacrylate monomer and a multivalent crosslinking compound reacted in the presence of a photoinitiator, wherein the nanoparticles comprise ions selected from groups 13 and 15 of the Periodic Table.

8. A formulation according to claim 7, wherein said multivalent crosslinking compound is a trivalent crosslinking compound.

* * * * *